United States Patent
Gans

(10) Patent No.: US 11,947,412 B2
(45) Date of Patent: *Apr. 2, 2024

(54) METHODS FOR ACTIVITY-BASED MEMORY MAINTENANCE OPERATIONS AND MEMORY DEVICES AND SYSTEMS EMPLOYING THE SAME

(71) Applicant: Lodestar Licensing Group LLC, Evanston, IL (US)

(72) Inventor: Dean D. Gans, Nampa, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/094,799

(22) Filed: Jan. 9, 2023

(65) Prior Publication Data

US 2023/0144541 A1    May 11, 2023

Related U.S. Application Data

(63) Continuation of application No. 16/707,151, filed on Dec. 9, 2019, now Pat. No. 11,550,650.

(Continued)

(51) Int. Cl.
*G11C 29/00* (2006.01)
*G06F 11/07* (2006.01)
(Continued)

(52) U.S. Cl.
CPC ........ *G06F 11/076* (2013.01); *G06F 11/3037* (2013.01); *G06F 12/0246* (2013.01);
(Continued)

(58) Field of Classification Search
CPC .............. G06F 11/076; G06F 11/3037; G06F 12/0246; G06F 13/1668; G11C 11/2257; G11C 11/2277; G11C 29/04
See application file for complete search history.

(56) References Cited

U.S. PATENT DOCUMENTS

| 6,147,921 A | 11/2000 | Novak et al. |
| 6,310,814 B1 | 10/2001 | Hampel et al. |

(Continued)

FOREIGN PATENT DOCUMENTS

| CN | 108292283 A | 7/2018 |
| KR | 10-2013-0127346 A | 11/2013 |

(Continued)

OTHER PUBLICATIONS

EP Patent Application No. 19843248.6—European Search Report, dated Mar. 18, 2022, 8 pages.

(Continued)

*Primary Examiner* — Christine T. Tu
(74) *Attorney, Agent, or Firm* — Holland & Hart LLP

(57) ABSTRACT

Memory devices and methods of operating memory devices in which maintenance operations can be scheduled on an as-needed basis for those memory portions where activity (e.g., operations in excess of a predetermined threshold) warrants a maintenance operation are disclosed. In one embodiment, an apparatus comprises a memory including a memory location, and circuitry configured to determine a count corresponding to a number of operations at the memory location, to schedule a maintenance operation for the memory location in response to the count exceeding a first predetermined threshold, and to decrease the count by an amount corresponding to the first predetermined threshold in response to executing the scheduled maintenance operation. The circuitry may be further configured to disallow, in response to determining that the count has reached a maximum permitted value, further operations at the memory location until after the count has been decreased.

20 Claims, 4 Drawing Sheets

Related U.S. Application Data

(60) Provisional application No. 62/784,085, filed on Dec. 21, 2018.

(51) Int. Cl.

| | | |
|---|---|---|
| *G06F 11/30* | (2006.01) | |
| *G06F 12/02* | (2006.01) | |
| *G06F 13/16* | (2006.01) | |
| *G11C 11/22* | (2006.01) | |
| *G11C 29/04* | (2006.01) | |

(52) U.S. Cl.
CPC ...... *G06F 13/1668* (2013.01); *G11C 11/2257* (2013.01); *G11C 11/2277* (2013.01); *G11C 29/04* (2013.01)

(56) References Cited

U.S. PATENT DOCUMENTS

| | | |
|---|---|---|
| 8,941,935 B1 | 1/2015 | Aho et al. |
| 9,384,821 B2 | 7/2016 | Bains et al. |
| 9,761,298 B2 | 9/2017 | Halbert et al. |
| 9,812,185 B2 | 11/2017 | Fisch et al. |
| 10,049,755 B2 | 8/2018 | Lee et al. |
| 10,156,998 B1 | 12/2018 | Colgrove et al. |
| 10,817,371 B2 | 10/2020 | Rooney et al. |
| 11,087,819 B2 | 8/2021 | Cowles et al. |
| 11,294,762 B2 | 4/2022 | Rooney et al. |
| 11,550,650 B2 * | 1/2023 | Gans ............... G06F 13/1668 |
| 2008/0183916 A1 | 7/2008 | Bellows et al. |
| 2008/0232184 A1 | 9/2008 | Ohsawa |
| 2008/0316848 A1 * | 12/2008 | Ohsawa ............ G11C 11/406 365/222 |
| 2009/0168576 A1 * | 7/2009 | Fujita ............... G11C 11/4091 365/207 |
| 2010/0157650 A1 | 6/2010 | Hashimoto et al. |
| 2011/0255357 A1 | 10/2011 | Pelley et al. |
| 2012/0155201 A1 | 6/2012 | Schreck et al. |
| 2013/0304982 A1 | 11/2013 | Jung et al. |
| 2014/0006703 A1 | 1/2014 | Bains et al. |
| 2014/0059287 A1 | 2/2014 | Bains et al. |
| 2014/0095780 A1 | 4/2014 | Bains et al. |
| 2014/0122788 A1 | 5/2014 | Swaminathan |
| 2014/0156923 A1 | 6/2014 | Bains et al. |
| 2014/0173239 A1 | 6/2014 | Schushan |
| 2014/0192605 A1 | 7/2014 | Crawford et al. |
| 2015/0109871 A1 | 4/2015 | Bains et al. |
| 2015/0206558 A1 | 7/2015 | Ni et al. |
| 2015/0262652 A1 | 9/2015 | Igarashi |
| 2015/0279441 A1 | 10/2015 | Greenberg et al. |
| 2015/0325291 A1 | 11/2015 | Aue |
| 2015/0339188 A1 | 11/2015 | Hu et al. |
| 2016/0118132 A1 | 4/2016 | Prins et al. |
| 2017/0110178 A1 | 4/2017 | Bains |
| 2017/0186481 A1 | 6/2017 | Oh et al. |
| 2018/0004415 A1 | 1/2018 | Lee et al. |
| 2018/0061483 A1 | 3/2018 | Morgan |
| 2020/0043545 A1 | 2/2020 | Gans |
| 2020/0111525 A1 | 4/2020 | Cowles et al. |
| 2020/0133517 A1 | 4/2020 | Shah et al. |
| 2020/0201698 A1 | 6/2020 | Gans |
| 2020/0210278 A1 | 7/2020 | Rooney et al. |
| 2020/0227116 A1 | 7/2020 | Qawami et al. |
| 2021/0042185 A1 | 2/2021 | Rooney et al. |
| 2021/0065831 A1 | 3/2021 | Galbraith et al. |
| 2021/0280236 A1 | 9/2021 | Gans |
| 2021/0358539 A1 | 11/2021 | Cowles et al. |
| 2022/0197740 A1 | 6/2022 | Rooney et al. |

FOREIGN PATENT DOCUMENTS

| | | |
|---|---|---|
| KR | 10-2015-0128598 A | 11/2015 |
| KR | 20180003713 A | 1/2018 |
| WO | 2006130276 A1 | 12/2006 |

OTHER PUBLICATIONS

KR Patent Application No. 10-2021-7006048—Korean Notice of Allowance, dated Jul. 20, 2022, with English Translation, 4 pages.
KR Patent Application No. 10-2021-7006048—Korean Office Action and Search Report, dated Dec. 15, 2021, with English Translation, 10 pages.
EP Patent Application No. 19871839.7—European Search Report, dated Jun. 1, 2022, 10 pages.
EP Patent Application No. 19898974.1—Extended European Search Report, dated Aug. 12, 2022, 9 pages.
International Application No. PCT/US2019/044857—International Search Report and Written Opinion, dated Nov. 21, 2019, 11 pages.
International Application No. PCT/US2019/055447—International Search Report and Written Opinion, dated Jan. 31, 2020, 10 pages.
International Application No. PCT/US2019/065220—International Search Report and Written Opinion, dated Apr. 9, 2020, 10 pages.
KR Patent Application No. 10-2021-7013688—Korean Office Action and Search Report, dated May 10, 2022, with English Translation, 13 pages.
Chinese patent office, "China Office Action," issued in connection with China Patent Application No. 201980084209.1 dated Nov. 30, 2023 (8 pages).
Korean Patent Office, "Office Action," issued in connection with Korean Patent Application No. 10-2021-7020773 dated Aug. 16, 2023 (15 pages) (8 pages of English Translation and 9 pages of Original Document).

* cited by examiner

METHODS FOR ACTIVITY-BASED MEMORY MAINTENANCE OPERATIONS AND MEMORY DEVICES AND SYSTEMS EMPLOYING THE SAME

CROSS-REFERENCE TO RELATED APPLICATION(S)

This application is a continuation of U.S. application Ser. No. 16/707,151, filed Dec. 9, 2019, which claims the benefit of U.S. Provisional Application No. 62/784,085, filed Dec. 21, 2018; which are incorporated herein by reference in their entireties.

TECHNICAL FIELD

The present disclosure generally relates to methods for activity-based memory maintenance operations and memory devices and systems employing the same.

BACKGROUND

Memory devices are widely used to store information related to various electronic devices such as computers, wireless communication devices, cameras, digital displays, and the like. Information is stored by programing different states of a memory cell. Various types of memory devices exist, including magnetic hard disks, random access memory (RAM), read only memory (ROM), dynamic RAM (DRAM), synchronous dynamic RAM (SDRAM), and others. Memory devices may be volatile or non-volatile. Improving memory devices, generally, may include increasing memory cell density, increasing read/write speeds or otherwise reducing operational latency, increasing reliability, increasing data retention, reducing power consumption, or reducing manufacturing costs, among other metrics.

DETAILED DESCRIPTION

Figure 1:
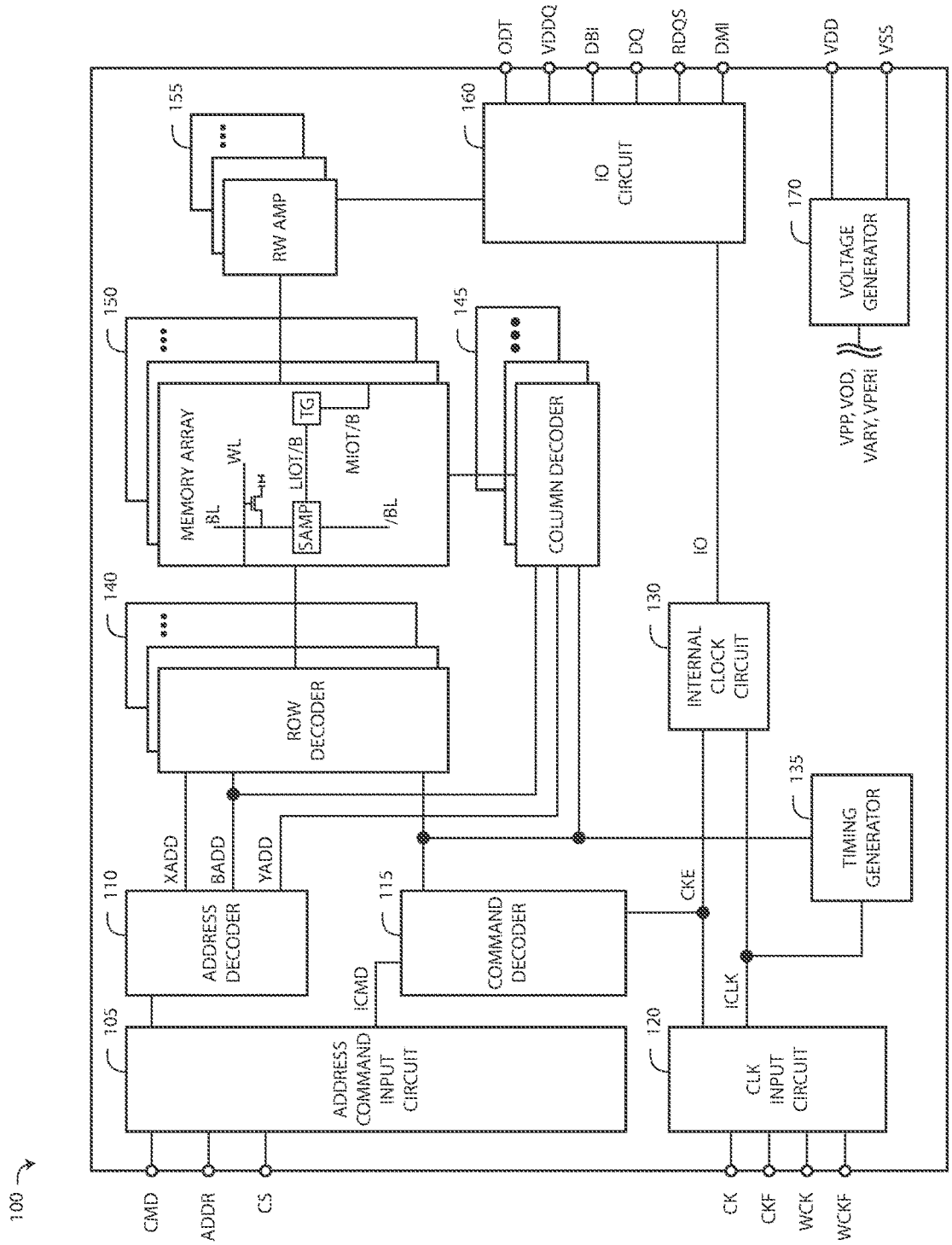
FIG. 1 is a simplified block diagram schematically illustrating a memory device in accordance with an embodiment of the present technology.

High data reliability, high speed of memory access, and reduced chip size are features that are demanded from semiconductor memory. Some semiconductor memory devices, such as FeRAM, store information as charge accumulated in cell capacitors that can be degraded by disturb mechanisms caused by repeated activity directed to the memory cells or their neighbors (e.g., physically adjacent cells or cells sharing one or more memory address components). To address these disturb mechanisms, maintenance operations (e.g., a refresh operation) can be performed to refresh the charge in the memory cells. Other types of activity-based degradation mechanisms, in which operations on a particular portion of the memory array can negatively impact that portion, or portions adjacent, near, or otherwise topologically related thereto, can also be mitigated by maintenance operations. Accordingly, to address these various potential activity-based degradations, memory devices can be configured to perform maintenance operations (e.g., reading and then re-writing the data to the same or to a new location, etc.).

One approach to ensuring that maintenance operations are provided frequently enough to prevent data degradation involves increasing the frequency with which maintenance operations are performed (e.g., by increasing the number of maintenance commands issued in a given window of time). Because maintenance operations can be power intensive, and can sometimes negatively impact the performance (e.g., responsiveness, reading and/or writing speed, etc.) of a memory device, scheduling more frequent maintenance operations for all of the memory portions based on a worst-case scenario can be inefficient, and particularly undesirable for memory applications in which power consumption is a significant concern (e.g., mobile devices powered by a limited battery supply).

Accordingly, several embodiments of the present technology are directed to memory devices, systems including memory devices, and methods of operating memory devices in which maintenance operations can be scheduled on an as-needed basis for those memory portions where activity (e.g., activations in excess of a predetermined threshold) warrants a maintenance operation. In one embodiment, an apparatus comprises a memory including a memory location, and circuitry configured to determine a count corresponding to a number of operations at the memory location, to schedule a maintenance operation for the memory location in response to the count exceeding a first predetermined threshold, and to decrease the count by an amount corresponding to the first predetermined threshold in response to executing the scheduled maintenance operation. The circuitry may be further configured to schedule, before the execution of the first maintenance operation, a second maintenance operation in response to the count exceeding the first predetermined threshold, and to decrease the count by the amount corresponding to the first predetermined threshold in response to executing the second scheduled maintenance operation. The circuitry may be further configured to disallow, in response to determining that the count has reached a maximum permitted value, further operations at the memory location until after the count has been decreased.

FIG. 1 is a block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least respective one main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address signal (BADD) and supply the bank address signal to both the row decoder 140 and the column decoder 145.

The command and address terminals may be supplied with command signals CMD, address signals ADDR, and chip selection signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK.

When a read command is issued and a row address and a column address are timely supplied with the read command, read data can be read from memory cells in the memory array 150 designated by these row address and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (not shown in FIG. 1). The read latency information RL can be defined in terms of clock cycles of the CK clock signal. For example, the read latency information RL can be a number of clock cycles of the CK signal after the read command is received by the memory device 100 when the associated read data is provided.

When a write command is issued and a row address and a column address are timely supplied with the command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (not shown in FIG. 1). The write latency WL information can be defined in terms of clock cycles of the CK clock signal. For example, the write latency WL information can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command/address input circuit 105. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be configured to perform maintenance operations on portions of the memory array 150 in response to commands received from a connected host device or memory controller. or otherwise change stored memory cell states to prevent imprint, to move data according to a wear-leveling algorithm to prevent premature wearout of some portion of a device's memory cells, or some combination thereof.

As set forth above, various activity-based effects can degrade the information stored in the memory array 150, such that modes of operation with greater delay between maintenance operations can potentially put data integrity at risk. Accordingly, in various embodiments of the present disclosure, a host device or controller can be configured to issue maintenance mode commands (e.g., in addition to regularly-scheduled periodic maintenance mode commands, or alternatively instead of regularly-scheduled periodic maintenance mode commands) to mitigate the possibility of activity-based degradation in the memory device 150. These maintenance mode commands may be scheduled at differing rates per time with flexibility in postponing a specified number of events to be made up at a later time.

According to an embodiment in which activity is tracked on a per-bank basis, a maintenance mode (MM) command sent by a connected host device can target a particular bank by address, such that the memory device receiving the command can limit its maintenance operation to a single bank, and not expend unnecessary time or power maintaining other banks that have not experienced a level of activity corresponding to potential data degradation. In this regard, a representative maintenance mode command is shown in Table 1, below:

TABLE 1

| CMD | Bank Org | SDR CS Pin | DDR Command/Address Pins | | | | | | | | | CK Edge |
|---|---|---|---|---|---|---|---|---|---|---|---|---|
| | | | CA0 | CA1 | CA2 | CA3 | CA4 | CA5 | CA6 | CA7 | CA8 | |
| MM | Any | H | L | L | L | H | H | H | L | V | V | R1 |
| | BG 16B 8B | X | BA0 | BA1 | BG0 BA2 | V | V | V | V | V | V | F1 |

The memory device 100 can track the addresses of the memory array 150 at which operations (e.g., maintenance operations) are executed (e.g., in an address pointer), and can further track the number of operations executed at the most recent address (e.g. in a bank counter). This arrangement can ensure that each bank 0-15 of the memory array 150 experiences at least one operation (e.g., by counting sixteen operations) at a given address before the address pointer is incremented and the cycle is repeated. According to one aspect of the present disclosure, a host device or controller operably connected to the memory device 100 can be configured to send maintenance mode (MM) commands to the memory device 100 to trigger the maintenance operations. MM commands provide time for the memory device 100 to internally manage its data integrity without having to perform other operations (e.g., read or write operations that communicate over a data bus or other operations that would occupy internal circuitry of the memory array). Because maintenance operations can prevent a memory device from communicating over the data bus for a number of clock cycles, efficient scheduling of bus utilization can be ensured by managing maintenance operations from the controller/host device.

In accordance with various aspects of the present technology, activity-triggered maintenance operations may include any one of a number of operations configured to restore a degraded memory cell state (e.g., to refresh or re-write data degraded due to a disturb mechanism), to invert One approach to mitigating activity-based effects with maintenance operations involves determining when a number of memory operations (e.g., activations) at a memory location (e.g., memory bank) exceeds a predetermined threshold, and scheduling a maintenance operation in response to the determination. Upon scheduling the maintenance operation, the tracked number of memory operations can be decreased by an amount corresponding to the predetermined threshold.

Figure 2:
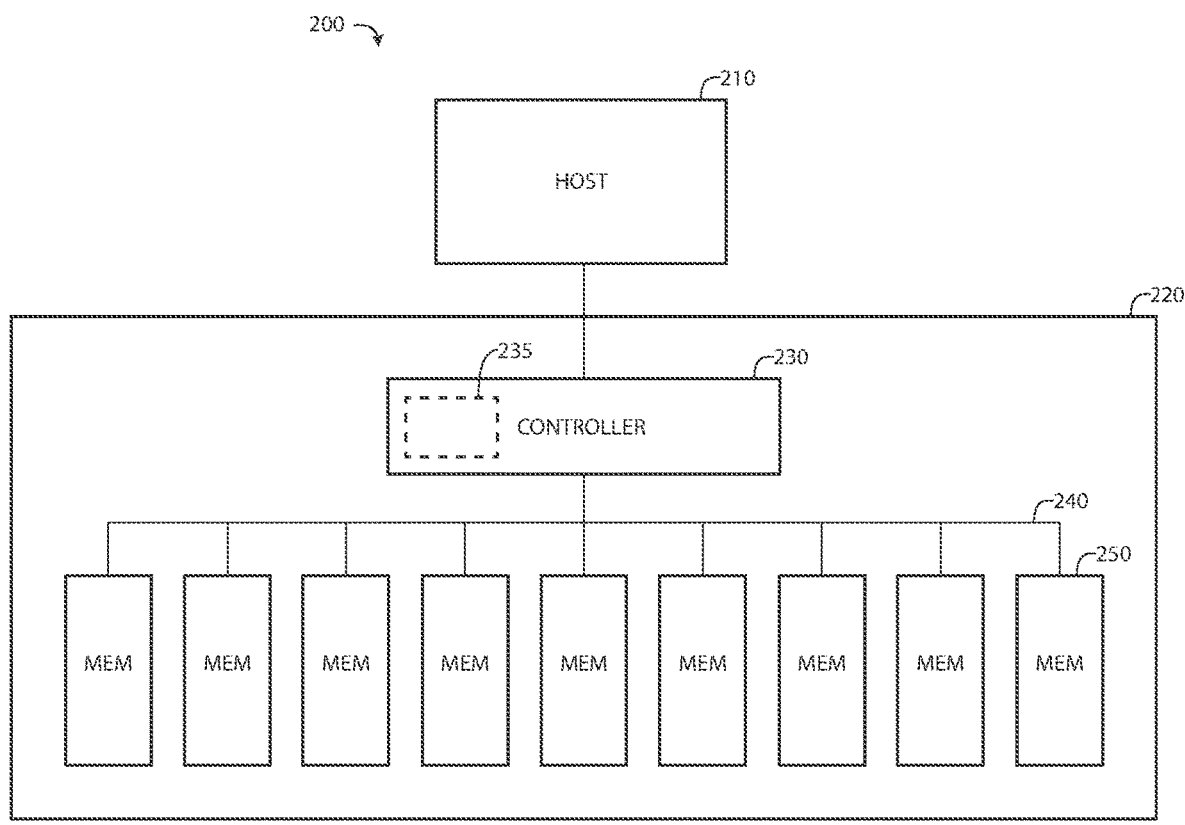
FIG. 2 is a simplified block diagram schematically illustrating a memory system in accordance with an embodiment of the present technology.

This may be better understood with reference to FIG. 2, in which a simplified block diagram schematically illustrates a memory system 200 in accordance with an embodiment of the present technology. Memory system 200 includes a host device 210 operably coupled to a memory module 220 (e.g., a dual in-line memory module (DIMM)). Memory module 220 can include a controller 230 operably connected by a bus 240 to a plurality of memory devices 250. In accordance with one aspect of the present disclosure, the controller 230 (and/or the host device 210) can maintain a counter 235 to track operations (e.g., activations) per bank of each memory device 250 of the memory module 220 (e.g., a Rolling Accumulated Activations (RAA) counter). If the RAA is determined to exceed a specified threshold (e.g., a Maximum Activation Count (MAC) threshold), the controller 230 (and/or the host device 210) can issue, or schedule for later issuance, a maintenance mode (MM) command to the impacted bank (or to a larger group of banks including the impacted bank, such as all banks of the memory device 220).

When the maintenance operation thus commanded is executed by the memory device 250, the count can be decreased (e.g., by an amount corresponding to the MAC threshold).

For example, in an embodiment in which the MAC threshold is 16 activations, the RAA counter may determine that a bank of one of the memory devices has experienced a cumulative 18 activations. In response to the determination, the controller 230 (and/or the host device 210) can issue a MM command to execute a maintenance operation at the memory location of the bank that has been impacted by the large number of activations. Following the operation, the value in the RAA counter (e.g., at the host device 210 and/or the controller 230) can be decreased by 16 (e.g., leaving a value of 2).

In accordance with one aspect of the present disclosure, the amount by which the value in the RAA counter is decreased need not be the same amount as the MAC threshold, but may correspond to the amount of the MAC threshold in another way. For example, in some embodiments, when device 210 issues a MM command, the value in the RAA counter may be decreased by a predetermined fraction (e.g., ½, ¾, etc.) of the MAC threshold, rather than by the full value of the MAC threshold.

In accordance with another aspect of the present disclosure, the temperature of the memory device may be further used to modify the amount by which the RAA counter is decreased following the execution of a maintenance operation (e.g., where a higher temperature causes the amount by which the RAA counter is decreased to be less than an amount by which it is decreased at a lower temperature, or vice versa).

In another example where the MAC threshold is 16 activations, the RAA counter may determine that a bank of one of the memory device has experienced 35 cumulative activations. In response, the host device 210 can schedule two MM commands directed to the impacted memory bank that, when actually implemented by the memory device 250, will each decrease the value in the RAA counter by 16.

By permitting the scheduling of future MM commands in response to the RAA counter exceeding an initial management threshold, the memory module 220 can permit flexible bus scheduling by the host device 210 to address activity-based disturb mechanisms. According to one aspect of the present disclosure, the memory module 220 can be configured to enforce a maximum value in the RAA counter for each bank (e.g., a RAA Maximum (RAAmax)), beyond which no further activations will be permitted before the value is decreased (e.g., decreased in response to the execution of a maintenance operation).

For example, in an embodiment in which the MAC threshold is 16 activations, and the maximum value permitted in the RAA counter is 64, the memory module 220 may permit the host device 210 (and/or the controller 230) to "postpone" up to four maintenance operations, but no more (e.g., as further activation commands directed to a bank in which the value for the RAA counter is 64 will be disallowed, preventing further increase in the RAA counter). In response to the execution of one scheduled MM command, the value may be decreased by an amount corresponding to the MAC threshold value (e.g., decreased by 16), thereby permitting 16 further activations before the maximum value permitted in the RAA counter is again reached.

According to one aspect of the present disclosure, both the host device 210 and the memory controller 230 may be configured to maintain RAA counters for each bank of each memory device 250. In this approach, activation commands that would cause the RAA counter value for a bank to exceed the maximum permitted value can be disallowed (e.g., by the memory controller 230) if issued, and prevented from issuing (e.g., by the host device 210).

In accordance with an aspect embodiment of the present disclosure, the values for the MAC and RAAmax may be stored in a mode register of each memory device 250. This may permit these values to be changed (e.g., by an end-user, a vendor, a system integrator, etc.).

According to yet another aspect of the present disclosure, the MAC value specified for a memory device (e.g., in a mode register of the memory device) may be modified according to the current temperature of the memory device. In this regard, at higher temperatures, the MAC value may be decreased to better protect against disturb effects that can more quickly accrue at higher operating temperatures. This feature may be implemented by storing MAC values in a look-up table (e.g., in a mode register or other storage location) sorted by temperature.

In accordance with another aspect of the present disclosure, the feature by which maintenance operations can be scheduled on an as-needed basis for those memory portions where activity (e.g., activations in excess of a predetermined threshold) warrants a maintenance operation can optionally be enabled or disabled based upon a user-selectable preference.

Figure 3:
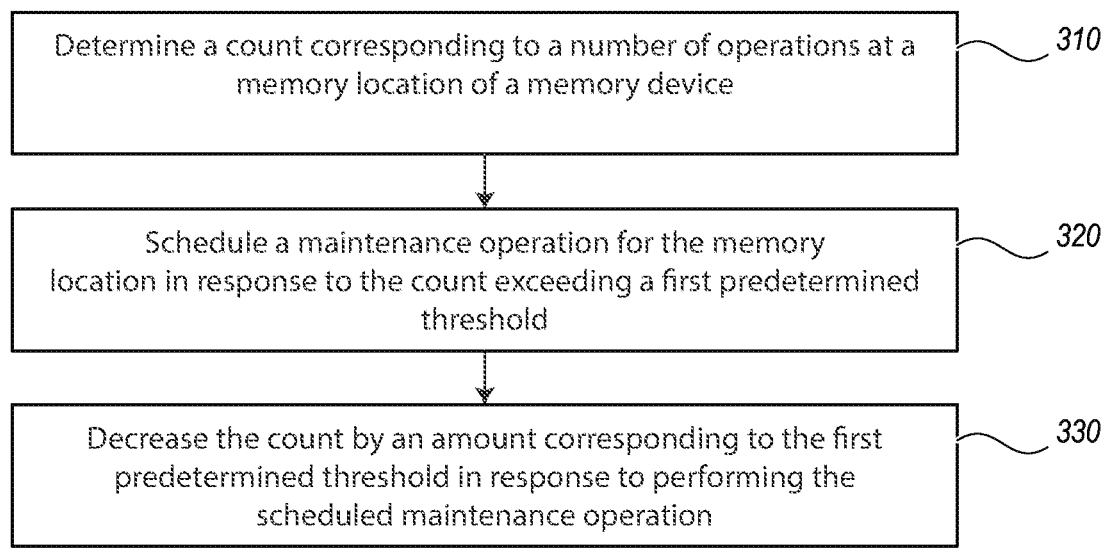
FIG. 3 is a flow chart illustrating a method of operating a memory system in accordance with an embodiment of the present technology.

FIG. 3 is a flow chart illustrating a method of operating a memory system in accordance with an embodiment of the present technology. The method includes determining a count corresponding to a number of activations at a memory location of a memory device (box 310). According to one aspect of the present disclosure, the determining features of box 310 may be implemented with a host device 210 and/or a controller 230, as illustrated in FIG. 2 in greater detail, above. The method further includes scheduling a maintenance operation for the memory location in response to the count exceeding a first predetermined threshold (box 320). According to one aspect of the present disclosure, the scheduling features of box 320 may be implemented with a host device 210 and/or a controller 230, as illustrated in FIG. 2 in greater detail, above. The method further includes decreasing the count by an amount corresponding to the first predetermined threshold in response to executing the scheduled maintenance operation (box 330). According to one aspect of the present disclosure, the decreasing features of box 330 may be implemented with a host device 210 and/or a controller 230, as illustrated in FIG. 2 in greater detail, above.

Figure 4:
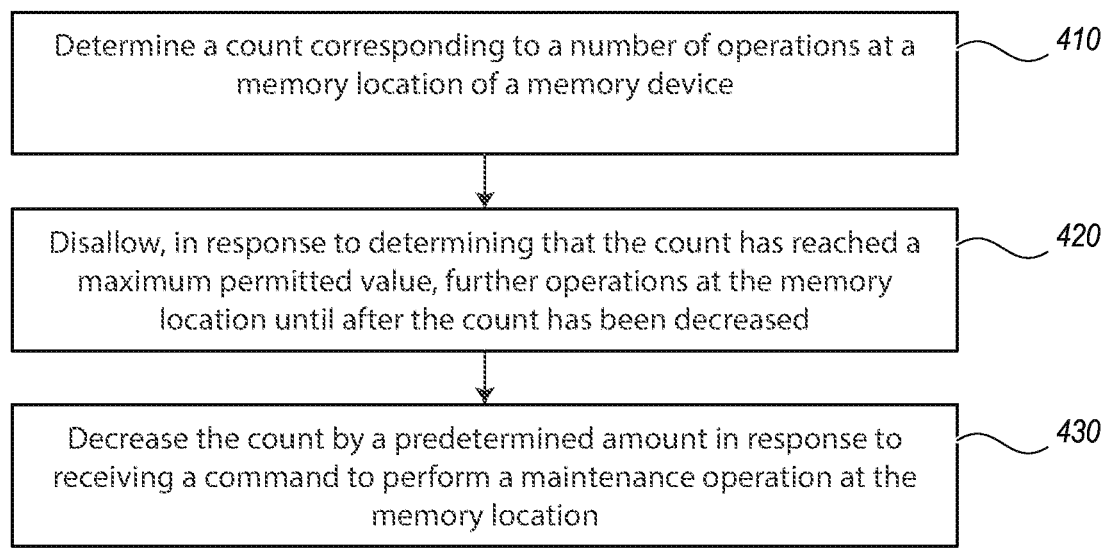
FIG. 4 is a flow chart illustrating a method of operating a memory system in accordance with an embodiment of the present technology.

FIG. 4 is a flow chart illustrating a method of operating a memory device in accordance with an embodiment of the present technology. The method includes determining a count corresponding to a number of activations at the memory location (box 410). According to one aspect of the present disclosure, the determining features of box 410 may be implemented with a host device 210 and/or a controller 230, as illustrated in FIG. 2 in greater detail, above. The method further includes disallowing, in response to determining that the count has reached a maximum permitted value, further activations at the memory location until after the count has been decreased (box 420). According to one aspect of the present disclosure, the disallowing features of box 420 may be implemented with a host device 210 and/or a controller 230, as illustrated in FIG. 2 in greater detail, above. The method further includes decreasing the count by a predetermined amount in response to receiving a command to execute a maintenance operation at the memory location (box 430). According to one aspect of the present disclosure, the decreasing features of box 430 may be implemented with a host device 210 and/or a controller 230, as illustrated in FIG. 2 in greater detail, above.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method, comprising:
   determining a count corresponding to a number of operations at a memory location of a memory device;
   scheduling a number of maintenance operations for the memory location in response to the count exceeding a first predetermined threshold, wherein the number of scheduled maintenance operations corresponds to an extent by which the count exceeds the first predetermined threshold; and
   decreasing the count by an amount that is less than the count in response to executing one or more of the number of scheduled maintenance operations.

2. The method of claim 1, wherein the number of scheduled maintenance operations is greater than one.

3. The method of claim 1, further comprising:
   disallowing, in response to determining that the count has reached a maximum permitted value, further operations at the memory location until after the count has been decreased.

4. The method of claim 1, wherein the memory location comprises a memory bank.

5. The method of claim 4, wherein the number of maintenance operations targets a subset of a plurality of rows of the memory bank impacted by the operations.

6. The method of claim 1, wherein the amount is a first amount, and further comprising:
   decreasing the count by a second amount in response to executing a periodic maintenance operation at the memory location.

7. The method of claim 6, wherein the periodic maintenance operation targets only a single memory bank including the memory location.

8. The method of claim 6, wherein the periodic maintenance operation targets a plurality of memory banks of the memory device.

9. The method of claim 1, wherein the memory location comprises a subset of a plurality of rows of the memory device.

10. An apparatus, comprising:
    a memory including a memory location; and
    circuitry configured to:
       determine a count corresponding to a number of operations at the memory location;
       schedule a number of maintenance operations for the memory location in response to the count exceeding a first predetermined threshold, wherein the number of scheduled maintenance operations corresponds to an extent by which the count exceeds the first predetermined threshold; and
       decrease the count by an amount that is less than the count in response to executing one or more of the number of scheduled maintenance operations.

11. The apparatus of claim 10, wherein the number of scheduled maintenance operations is greater than one.

12. The apparatus of claim 10, wherein the circuitry is further configured to:
    disallow, in response to determining that the count has reached a maximum permitted value, further operations at the memory location until after the count has been decreased.

13. The apparatus of claim 10, wherein the memory location comprises a memory bank.

14. The apparatus of claim 13, wherein the number of maintenance operations targets a subset of a plurality of rows of the memory bank impacted by the operations.

15. The apparatus of claim 10, wherein the amount is a first amount, and wherein the circuitry is further configured to:
  decrease the count by a second amount in response to executing a periodic maintenance operation at the memory location.

16. The apparatus of claim 15, wherein the periodic maintenance operation targets only a single memory bank including the memory location.

17. The apparatus of claim 15, wherein the periodic maintenance operation targets a plurality of memory banks of the memory.

18. The apparatus of claim 10, wherein the memory comprises a ferroelectric memory (FeRAM) device.

19. An apparatus, comprising:
  a memory including a memory location; and
  circuitry configured to:
    determine a count corresponding to a number of operations at the memory location; and
    schedule a number of maintenance operations for the memory location in response to the count exceeding a predetermined threshold, wherein the number of scheduled maintenance operations corresponds to an extent by which the count exceeds the predetermined threshold.

20. The apparatus of claim 19, wherein the number is greater than one.

* * * * *